(12) United States Patent
Chen et al.

(10) Patent No.: US 12,738,627 B2
(45) Date of Patent: Sep. 15, 2026

(54) HEAT DISSIPATION MODULE AND ANTENNA ARRAY DEVICE HAVING SAME

(71) Applicant: Chiun Mai Communication Systems, Inc., New Taipei (TW)

(72) Inventors: Chun-Chih Chen, New Taipei (TW); Kuang-Chen Wu, New Taipei (TW); Ke-Xuan Luo, New Taipei (TW); Po-Ching Huang, New Taipei (TW)

(73) Assignee: Chiun Mai Communication Systems, Inc., New Taipei (TW)

( * ) Notice: Subject to any disclaimer, the term of this patent is extended or adjusted under 35 U.S.C. 154(b) by 0 days.

(21) Appl. No.: 18/819,353

(22) Filed: Aug. 29, 2024

(65) Prior Publication Data

US 2025/0286261 A1 Sep. 11, 2025

(30) Foreign Application Priority Data

Mar. 11, 2024 (CN) ......................... 202410274559.7

(51) Int. Cl.

*H01Q 1/02* (2006.01)
*H01Q 1/12* (2006.01)
*H01Q 1/42* (2006.01)
*H01Q 3/36* (2006.01)
*H05K 1/02* (2006.01)
*H05K 7/20* (2006.01)

(52) U.S. Cl.

CPC ............... *H01Q 1/02* (2013.01); *H01Q 1/125* (2013.01); *H01Q 1/42* (2013.01); *H01Q 3/36* (2013.01); *H05K 1/0203* (2013.01); *H05K 7/2039* (2013.01); *H05K 2201/10098* (2013.01)

(58) Field of Classification Search

CPC ............ H01Q 1/02; H01Q 1/125; H01Q 1/42; H01Q 3/36; H05K 1/0203; H05K 2201/10098; H05K 7/2039

See application file for complete search history.

(56) References Cited

U.S. PATENT DOCUMENTS 11,330,738 B1 5/2022 Refai-Ahmed et al.
2007/0026567 A1 2/2007 Beer et al.
2016/0127003 A1* 5/2016 Xu ......................... H01Q 21/28 455/562.1
2017/0104277 A1* 4/2017 Viscarra ................. H01Q 1/526
2018/0006014 A1* 1/2018 Mayer .................. H05K 1/0259

(Continued)

FOREIGN PATENT DOCUMENTS

CN 113225972 A 8/2021
CN 115020956 A 9/2022

(Continued)

*Primary Examiner* — Thien M Le
(74) *Attorney, Agent, or Firm* — ScienBiziP, P.C.

(57) ABSTRACT

A heat dissipation module and an antenna array device applying the heat dissipation module are provided, the antenna array device includes an upper cover and a circuit board, the heat dissipation module includes a body; a plurality of heat-conducting structures arranged in an array on one side of the body; a plurality of supporting structures supporting the circuit board, the plurality of heat-conducting structures and the plurality of supporting structures arranged on a same side of the body; and a plurality of connecting structures arranged on an edge of the body and connected to the upper cover.

20 Claims, 12 Drawing Sheets

10

VI
110
148
III
III
VI
150

(56) References Cited

U.S. PATENT DOCUMENTS

2018/0219277 A1 8/2018 Hirata et al.
2019/0006731 A1 1/2019 Chiu
2019/0327855 A1* 10/2019 Timmins .................. H01Q 1/02
2020/0052362 A1* 2/2020 Yu ........................ H01Q 1/2283
2020/0233315 A1* 7/2020 Nije .................... G03F 7/70616
2020/0381799 A1* 12/2020 Milroy ..................... H01Q 3/04
2020/0395678 A1* 12/2020 Shamblin ............... H05K 1/144
2021/0091450 A1* 3/2021 Park ....................... H01Q 1/243
2022/0115760 A1 4/2022 Ji et al.
2023/0344109 A1 10/2023 Kim et al.
2023/0421119 A1* 12/2023 Komposch ............ H01L 23/055
2024/0120635 A1* 4/2024 Tang .................. H01Q 15/0013
2024/0204864 A1* 6/2024 Voss ................... H04B 7/18513

FOREIGN PATENT DOCUMENTS

TW I778820 B 9/2022
WO 2017086377 A1 5/2017

* cited by examiner

HEAT DISSIPATION MODULE AND ANTENNA ARRAY DEVICE HAVING SAME

CROSS-REFERENCE TO RELATED APPLICATIONS

This application claims priority to Chinese Patent Application No. 202410274559.7 filed on Mar. 11, 2024, in China National Intellectual Property Administration, the contents of which are incorporated by reference herein.

FIELD

The subject matter herein generally relates to antenna technology field, and more particularly to a heat dissipation module and an antenna array device having the heat dissipation module.

BACKGROUND

An antenna system composed of many identical single antennas arranged in a certain pattern is also called an antenna array. A phased array antenna formed by the antenna array can efficiently communicate with low-orbit satellites due to its high flexibility and wide-angle scanning advantages. With the development of low-orbit satellite communication technology, wireless communication devices equipped with antenna arrays that can communicate with low-orbit satellites have also emerged. However, the antenna array has poor heat dissipation performance, especially in the narrow space of the wireless communication device. If the heat generated by the antenna array during operation cannot be quickly dissipated, the signal transmission quality will be affected.

BRIEF DESCRIPTION OF THE DRAWINGS

Implementations of the present disclosure will now be described, by way of embodiments, with reference to the attached figures.

DETAILED DESCRIPTION

Figure 1:
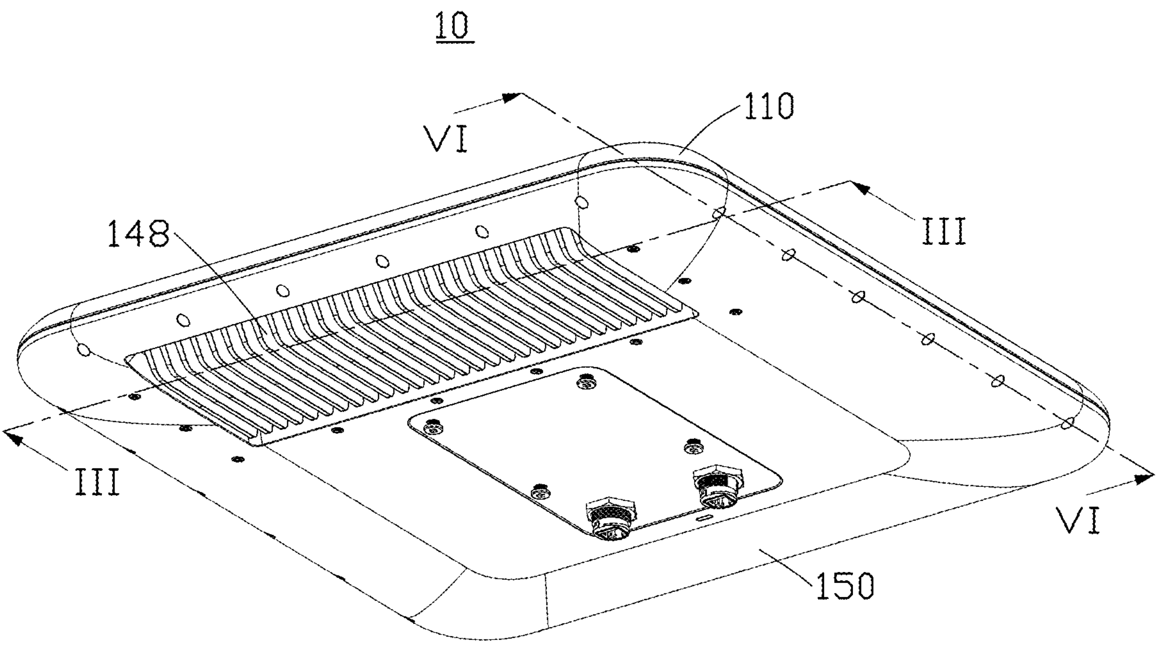
FIG. 1 is a structural diagram of an antenna array device according to an embodiment of the present application.

It will be appreciated that for simplicity and clarity of illustration, where appropriate, reference numerals have been repeated among the different figures to indicate corresponding or analogous elements. Additionally, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "substantially" is defined to be essentially conforming to the particular dimension, shape, or another word that "substantially" modifies, such that the component need not be exact. For example, "substantially cylindrical" means that the object resembles a cylinder, but can have one or more deviations from a true cylinder. The term "comprising" means "including, but not necessarily limited to"; it specifically indicates open-ended inclusion or membership in a so-described combination, group, series, and the like.

An antenna system composed of many identical single antennas arranged in a certain pattern is also called an antenna array. A phased array antenna formed by the antenna array can efficiently communicate with low-orbit satellites due to its high flexibility and wide-angle scanning advantages. With the development of low-orbit satellite communication technology, wireless communication devices equipped with antenna arrays that can communicate with low-orbit satellites have also emerged. However, the antenna array has poor heat dissipation performance, especially in the narrow space of the wireless communication device. If the heat generated by the antenna array during operation cannot be quickly dissipated, the signal transmission quality will be affected.

Based on this, the present application provides a heat dissipation module and an antenna array device having the heat dissipation module, which can accelerate a heat dissipation speed of the antenna array.

Referring to FIG. 1, FIG. 1 illustrates a structural diagram of an antenna array device 10 according to an embodiment of the present application. The antenna array device 10 is used to achieve communication with one or more of low-orbit satellites, communication base stations, and wireless communication devices.

Figure 2:
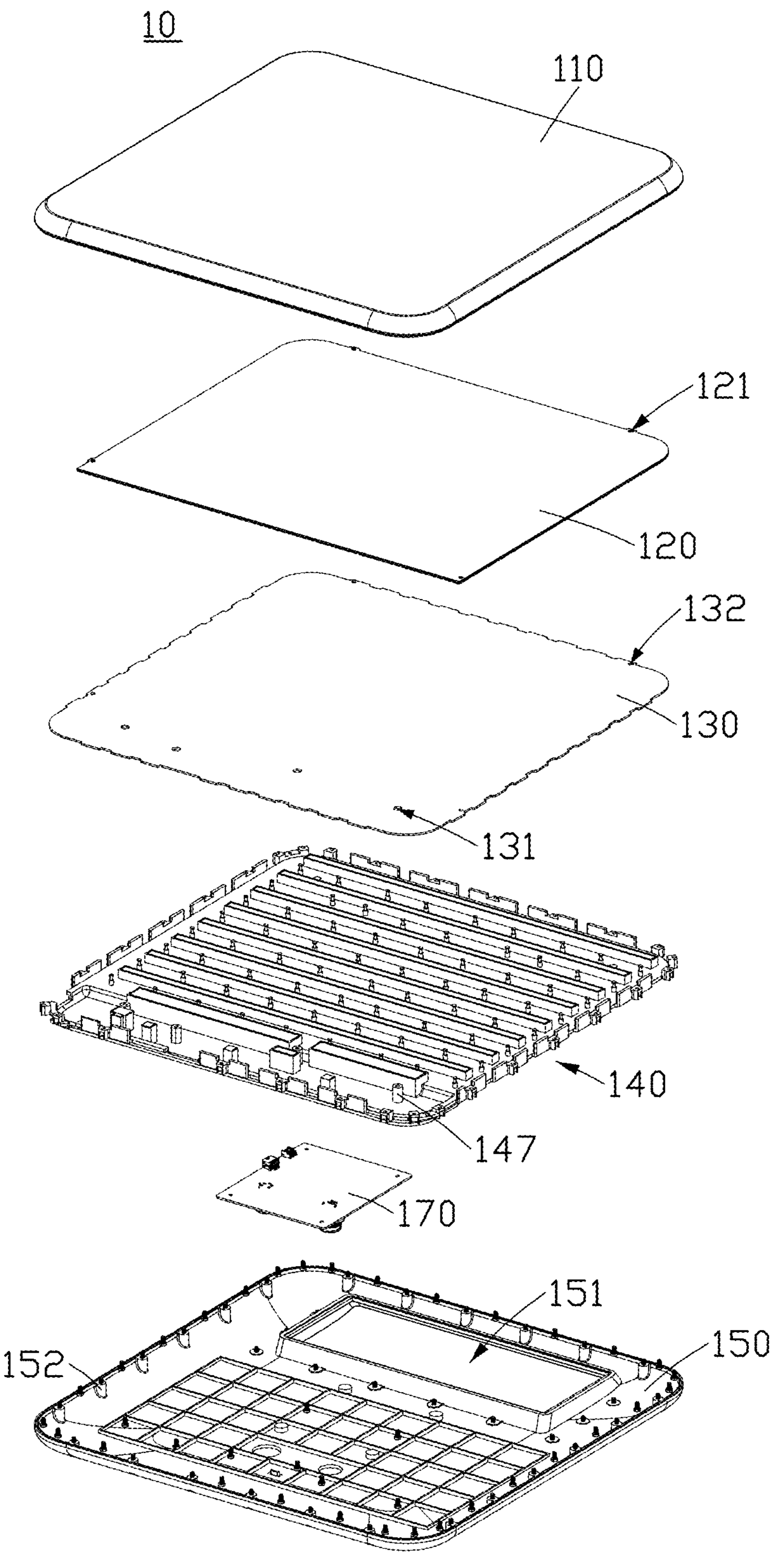
FIG. 2 is a partial explosive view of the antenna array device shown in FIG. 1.

Referring to FIG. 2, the antenna array device 10 includes an upper cover 110, a radiation module 120, a circuit board 130, a heat dissipation module 140, and a lower cover 150. The radiation module 120 is configured to transmit or receive signals to realize communications between the antenna array device 10 and other communication devices, such as low-orbit satellites, communication base stations, or wireless communication devices, etc. Furthermore, the radiation module 120 includes at least one radiation layer and at least one substrate layer. The radiation layer is provided with a plurality of radiation units. The plurality of radiation units cooperatively form the antenna array for effectively realize communications between the antenna array device 10 and the low-orbit satellites.

Figure 3:
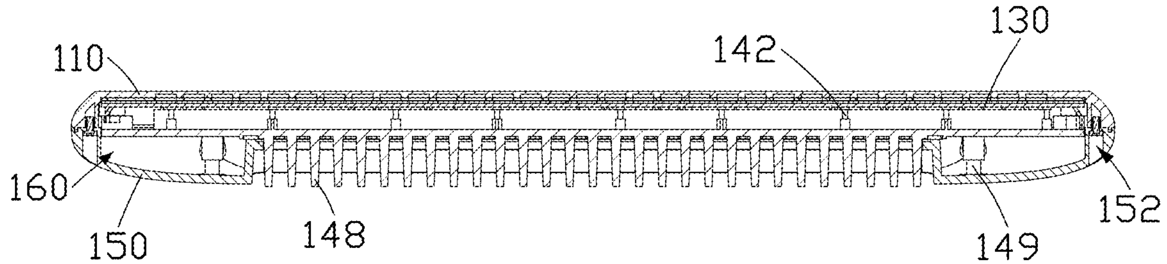
FIG. 3 is a cross-sectional view along an III-III line in FIG. 1.

The antenna array includes a receiving antenna array and/or a transmitting antenna array. When the antenna array includes the receiving antenna array and the transmitting antenna array, a part of the plurality of radiation units may form the receiving antenna array, and the other part of the plurality of radiation units may form the transmitting antenna array. The circuit board 130 is provided with radio-frequency circuits, control circuits, etc. for realizing communication control to the antenna array device 10. The heat dissipation module 140 is in contact with the circuit board 130 for dissipating heat from the circuit board 130 and/or components on the circuit board 130 to decrease a temperature of the antenna array device 10 and ensure a normal operation of the antenna array device 10. Referring to FIG. 3 together, the upper cover 110 and the lower cover 150 are connected and cooperatively form a receiving space 160. The radiation module 120, the circuit board 130, and the heat dissipation module 140 are correspondingly overlapped and received in the receiving space 160.

Figure 4:
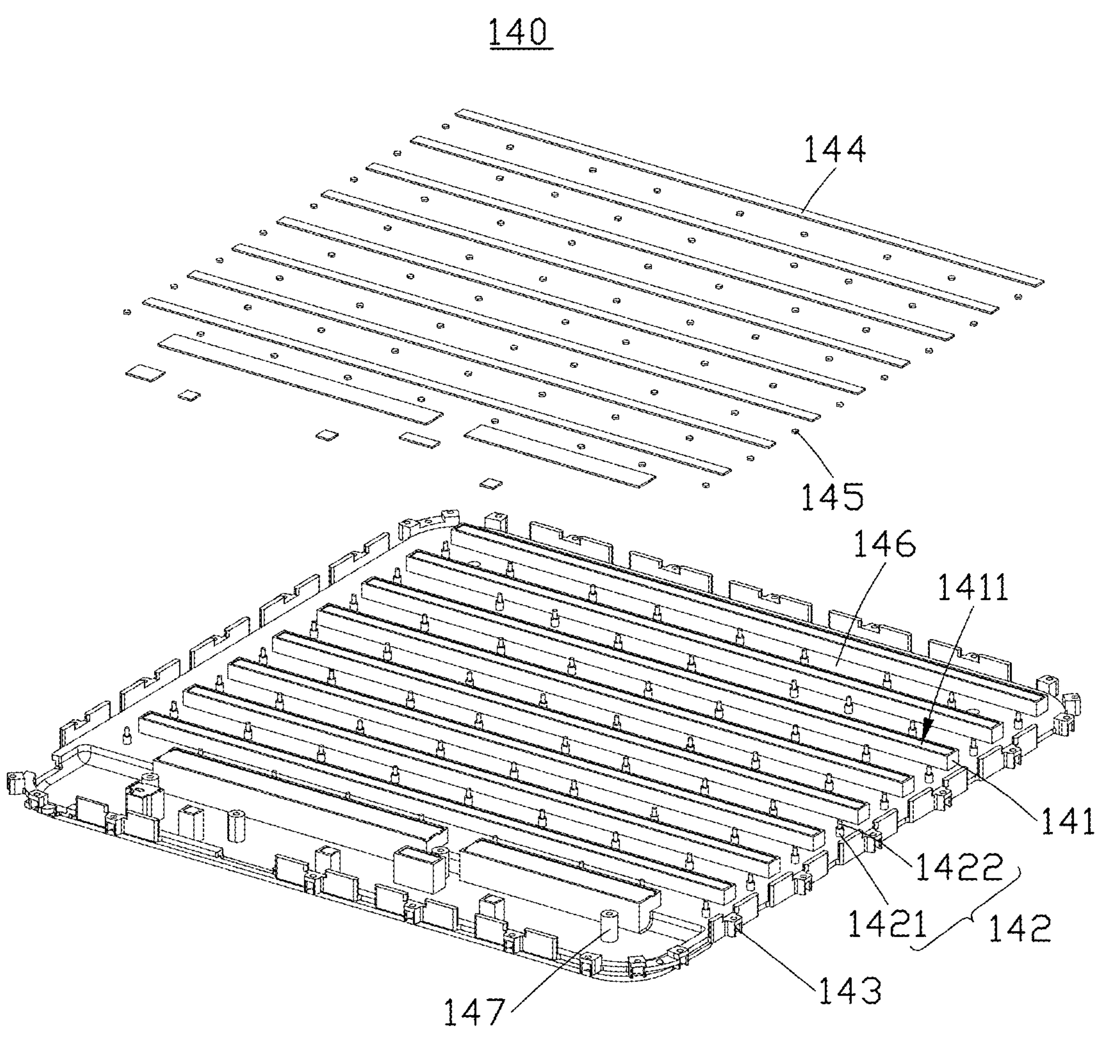
FIG. 4 is an explosive view of a heat dissipation module of the antenna array device shown in FIG. 1.

Referring to FIG. 4, the heat dissipation module 140 includes a plurality of heat-conducting structures 141, a plurality of supporting structures 142, a plurality of connecting structures 143, and a body 146. The body 146 includes a first side and a second side that are opposite to each other. Please refer to FIG. 2 and FIG. 4, a side of the body 146 close to the circuit board 130 is the first side, and a side of the body 146 away from the circuit board 130 is the second side. The plurality of heat-conducting structures 141 and the plurality of supporting structures 142 are disposed on the first side of the body 146. The plurality of connecting structures 143 are disposed on an edge of the body 146.

The plurality of heat-conducting structures 141 are arranged in an array on one side of the body 146. Each heat-conducting structure 141 is made of a heat-conducting material. The heat-conducting material includes but is not limited to any one or a combination of two or more of heat-conducting plastics, ceramics, and metals. In some embodiments, the heat-conducting structures 141 may be made of one or two or more alloys of gold, silver, copper, iron, aluminum and tin. In other embodiments, the heat-conducting structures 141 may be made of one or a combination of any of ceramic materials such as silicon oxide, aluminum oxide, and zinc oxide.

Referring to FIG. 2, in the embodiments of the present application, the radiation module 120 is disposed on a side of the circuit board 130 away from the heat dissipation module 140, that is, the plurality of radiation units are disposed on a side of the circuit board 130 away from the heat dissipation module 140. The RF circuit on the circuit board 130 may include a plurality of RF modules (not shown). The plurality of RF modules on the circuit boards 130 may be arranged one-to-one corresponding to the plurality of radiating units in the radiation module 120. The RF module includes but is not limited to at least one of a waveform generator, a signal generator, an analog-to-digital conversion (ADC), a phase shifter, and a power divider. For instance, when the radiation module 120 includes 1024 radiation units, the RF circuit on the circuit board 130 may include corresponding 1024 RF modules. The radiation units form a first array, the RF modules form a second array, the first array and the second array correspond to each other. In this way, it is urgent to dissipate the heat from the RF modules on the circuit board 130 to maintain the normal operation of the RF modules and the corresponding radiation units. In the present application, the plurality of heat-conducting structures 141 are arranged on the other side of the circuit board 130 away from the plurality of radiation units. The plurality of heat-conducting structures 141 are arranged in an array, for example, forming a third array. The third array corresponds to the second array. Since the second array corresponds to the first array, the third array corresponds to the first array. In other words, the plurality of heat-conducting structures 141 are arranged corresponding to the plurality of radiation units. In this way, each heat-conducting structure 141 can respectively contact the circuit board 130 and/or the corresponding RF module on the circuit board 130, and each heat-conducting structure 141 is used to conduct heat from the circuit board 130 and/or the corresponding RF module to itself, thereby reducing the temperature of the circuit board 130 and/or the RF modules, thereby ensuring the normal operation of the antenna array device 10. In the present application, the RF modules are disposed on the side of the circuit board 130 close to the heat dissipation module 140. In this way, the heat-conducting structures 141 can directly contact the RF modules to conduct the heat generated by the RF modules to the outside.

In some embodiments, each heat-conducting structure 141 is a strip structure, and the plurality of heat-conducting structures 141 are arranged in rows to form an array. Thus, when the plurality of RF modules on the circuit board 130 are arranged in rows, the plurality of heat-conducting structure 141 can respectively correspond to the plurality of RF modules arranged in rows and simultaneously conduct heat. The present application does not limit the number of heat-conducting structures 141. For example, in other embodiments, the plurality of heat-conducting structures 141 may also be arranged in a one-to-one correspondence with the plurality of RF modules, so that the number of the plurality of heat-conducting structures 141 may be equal to the number of the plurality of RF modules. In other embodiments, each heat-conducting structure 141 may also be a circular structure or a polygonal structure, etc., he present application does not impose any structural limitation on the heat-conducting structure 141.

Figure 5:
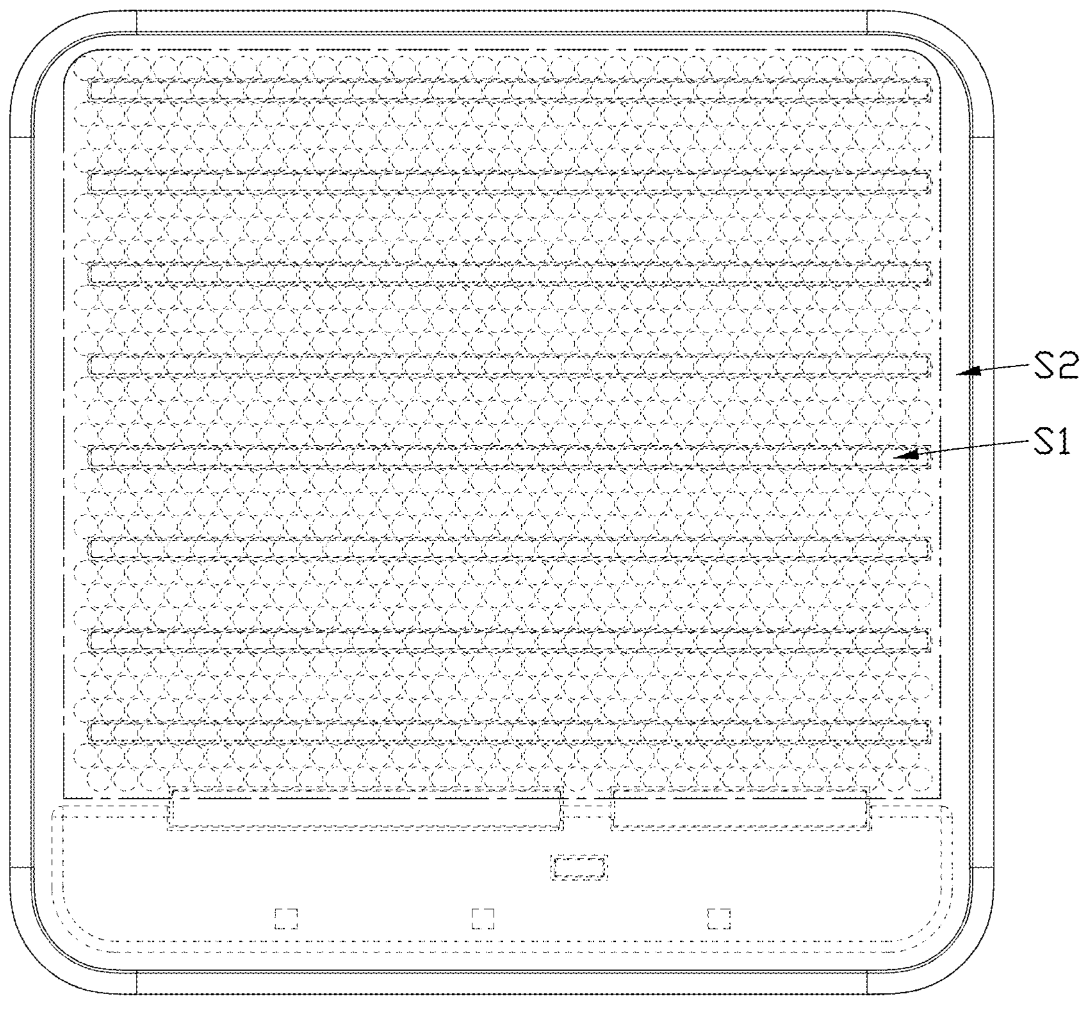
FIG. 5 is a schematic diagram showing a ratio of an area of several heat-conducting structures to an area of several radiation units.

Referring to FIG. 5, FIG. 5 is a schematic diagram of the areas of the plurality of heat-conducting structures 141 and the areas of the plurality of radiation units, wherein S1 is the area of a heat-conducting structure among the plurality of heat-conducting structures 141, and S2 is the area occupied by the plurality of radiation units. In some embodiments, a ratio of the area of the plurality of heat-conducting structures 141 (i.e., all S1) compared to the area of the plurality of radiation units (i.e., S2) is greater than or equals to 20%. In this way, the plurality of heat-conducting structures 141 can effectively dissipate heat for the antenna array device 10, ensuring that the antenna array device 10 operates normally.

Referring to FIG. 4 again, in some embodiments, the heat dissipation module 140 further includes a plurality of heat conductive sheets 144. The heat conductive sheets 144 are disposed between the RF modules and the heat conductive structures 141, or the heat conductive sheets 144 are disposed between the circuit board 130 and the heat conductive structures 141. A heat conductivity of the heat conductive sheet 144 is greater than or equal to 0.8 W/Mk. A hardness of the heat conductive sheet 144 is greater than or equal to 10 Shore, and the hardness of the heat conductive sheet 144 is less than or equal to 70 Shore. In other words, the heat conductive sheet 144 has a heat conductive property and has a certain elasticity. For example, the heat conductive sheet 144 includes but is not limited to any one of a heat conductive silicone sheet, a heat conductive tape, a heat conductive paste, a heat conductive putty, a heat conductive sealing glue, a heat conductive glass fiber cloth, a ceramic heat sink, a graphite sheet, graphene, a phase change material, and a composite material. When the heat conductive structure 141 is formed of a heat conductive material with greater hardness and the heat conductive structure 141 is in direct contact with the circuit board 130 or the RF modules on the circuit board 130, the heat conductive structure 141 may damage the circuit board 130 or the RF modules. Therefore, in the embodiments, by providing the heat conductive sheets 144 between the heat conductive structures 141 and the RF modules (or the circuit board 130), the heat of the circuit board 130 or the RF modules on the circuit board 130 can be transferred to the heat conductive structures 141 through the heat conductive sheets 144, while reducing the probability of damage to the RF modules (or the circuit board 130).

Accordingly, in some embodiments, at least one end of the heat-conducting structure 141 is further provided with a limiting portion 1411. The limiting portion 1411 is used to limit the heat conductive sheet 144. In one embodiment of the present application, a groove is provided on an upper surface of the heat conductive structure 141 close to the circuit board 130 to form the limiting portion 1411. The heat conductive sheet 144 is disposed in the limiting portion 1411. When the heat conductive sheet 144 is disposed in the limiting portion 1411, a height of the surface of the heat conductive sheet 144 is greater than a height of the upper surface of the heat conductive structure 141, and a thickness of the heat conductive sheet 144 is greater than a gap between the limiting portion 1411 and the RF module (or circuit board 130). That is to say, two sides of the heat conductive sheet 144 are in close contact with an inner surface of the limiting portion 1411 and the RF module (or the circuit board 130) respectively. In this way, the heat conductive sheet 144 can transfer the heat on the RF module (or circuit board 130) to the heat conductive structure 141, and the heat conductive sheet 144 prevents the heat conductive structure 141 from directly contacting the RF module (or circuit board 130), thereby reducing the probability of damage to the RF module (or circuit board 130). In the embodiment, a length of the limiting portion 1411 is substantially the same as a length of the heat conductive structure 141. Thus, only one groove needs to be formed on the surface of each heat conducting structure 141 to form the corresponding limiting portion 1411. In other embodiments, grooves may be defined at both ends of the heat conductive structure 141 to form the limiting portions 1411, or in other embodiments, three or more grooves may be defined on the heat conducting structure 141 to form the limiting portions 1411. That is to say, the present application does not limit the quantity and location of the limiting portions 1411 on the heat conductive structures 141. Accordingly, the quantity of heat conductive sheets 144 in the present application can be adjusted according to the quantity of limiting portions 1411, and the present application does not limit the quantity of the heat conductive sheets 144.

Referring to FIG. 4, each supporting structure 142 of the heat dissipation module 140 is used to support the circuit board 130. In order to ensure the accuracy of phase control of the antenna array formed by the radiation module 120, the radiation layer and the dielectric layer of the radiation module 120 should be prevented from shifting as much as possible. In the present application, the circuit board 130 is supported by the supporting structures 142 to fix the radiation module 120 between the circuit board 130 and the upper cover 110 (see FIG. 2), thereby improving the stability of the radiation module 120 and avoiding misalignment of the radiation layer or the dielectric layer of the radiation module 120, which would affect the phase control accuracy and radiation efficiency of the antenna array device 10. Specifically, the supporting structures 142 contact positions of the circuit board 130 where no radio frequency module or circuit is arranged. Thus, the probability of the supporting structures 142 damaging the circuit or electronic components on the circuit board 130 can be reduced. In some embodiments, the supporting structures 142 are made of metal material, so that the supporting structures 142 contact the positions of the circuit board 130 where no RF module or circuit is arranged, on the one hand, it can conduct heat to the circuit board 130, and on the other hand, it can reduce the interference of the supporting structures 142 to the radiation module 120 and the circuit on the circuit board 130.

Referring to FIG. 4, in some embodiments, each supporting structure 142 includes a first supporting portion 1421 and a second supporting portion 1422. A diameter of the first supporting portion 1421 is greater than a diameter of the second supporting portion 1422. One end of the first supporting portion 1421 is connected to the body 146, the other end of the first supporting portion 1421 is connected to one end of the second supporting portion 1422, and the other end of the second supporting portion 1422 abuts against the circuit board 130. Since the supporting structures 142 are used to support the circuit board 130, the supporting structures 142 need to reach a certain length to contact the circuit board 130 to play a supporting role. Further, in order to avoid the supporting structures 142 being too long and affecting the strength of the supporting structures 142, a diameter of the supporting structure 142 is increased to increase the strength of the support structure 142. In order to avoid a contact area between the supporting structures 142 and the circuit board 130 being too large and affecting the circuit layout design of the circuit board 130, a structure with a small head and a large bottom is designed to form the first supporting portion 1421 and the second supporting portion 1422. In this way, the support strength of the supporting structures 142 can be enhanced while reducing the impact of the supporting structures 142 to the circuit board 130.

The first supporting portion 1421 and the second supporting portion 1422 may be integrally formed or separately connected, and are not limited by this application.

In other embodiments, the supporting structure 142 may also be a cylinder or other polygonal cylinders, etc. The present application does not limit the specific shape of the supporting structure 142.

In some embodiments, the antenna array device 10 further includes a plurality of buffers 145. The buffers 145 are disposed between the supporting structures 142 and the circuit board 130. The buffers 145 may be formed by elastic material. The buffers 145 are used to buffer a moment when the supporting structures 142 and the circuit board 130 (see FIG. 2) collide with each other, thereby reducing a probability of damaging the circuit board 130 due to an abutment between the supporting structures 142 and the circuit board 130. That is, one end of the second supporting portion 1422 away from the first supporting portion 1421 may abut against the circuit board 130 through the buffers 145. In some embodiments, the buffers 145 may be any one of sponge, rubber and foam.

The plurality of connecting structures 143 are used to connect the body 146 and the upper cover 110. Through the connection between the connecting structures 143 and the upper cover 110, the radiation module 120 and the circuit board 130 can be further fixed between the upper cover 110 and the heat dissipation module 140 (see FIG. 2). In this way, on the one hand, the heat dissipation module 140 can be in close contact with the circuit board 130, thereby effectively conducting the heat of the circuit board 130 and the RF module on the circuit board 130; on the other hand, the radiation module 120 and the circuit board 130 can be limited between the upper cover 110 and the heat dissipation module 140, reducing the probability of displacement of the radiation layer and the dielectric layer of the radiation module 120, thereby increasing the working accuracy of the antenna array device 10. In some embodiments, the connecting structures 143 may be connecting holes formed on an edge of the body 146. Accordingly, an edge of the inner side (i.e., a side close to the radiation module 120) of the upper cover 110 is also provided with corresponding matching connection structures (not shown in the figures). For example, in some embodiments, connection holes are provided on the edge of the body 146 as the connecting structures 143. The edge of the inner side of the upper cover 110 is provided with matching connection holes as the matching connecting structures. The connection between the body 146 and the upper cover 110 can be achieved by passing connecting members through the connecting structures 143 and the matching connecting structures. The connecting structures 143 can be made of metal material or non-metal material, which is not limited in the present application.

Please refer to FIG. 2 again, in some embodiments, a first side of the body 146 is further provided with a plurality of positioning posts 147. The plurality of positioning posts 147 are used to achieve preliminary positioning between the heat dissipation module 140, the circuit board 130, and the upper cover 110. Specifically, corresponding to the plurality of positioning posts 147, the circuit board 130 is provided with a plurality of first positioning holes 131. Mounting posts (not shown in the figures) are provided on the inner side of the upper cover 110. A through hole is provided in the positioning post 147, and a receiving hole is provided in the mounting post. The through hole in the positioning post 147 is aligned with the corresponding first positioning hole 131 and the receiving hole in the mounting column, and the positioning member passes through the through hole and the first positioning hole 131 and is partially received in the receiving hole of the mounting post, thereby preliminarily achieving the preliminary positioning of the upper cover 110, the circuit board 130, and the heat dissipation module 140. The positioning post 147 can be made of metal material or non-metal material, and this application is not limited to this.

Figure 6:
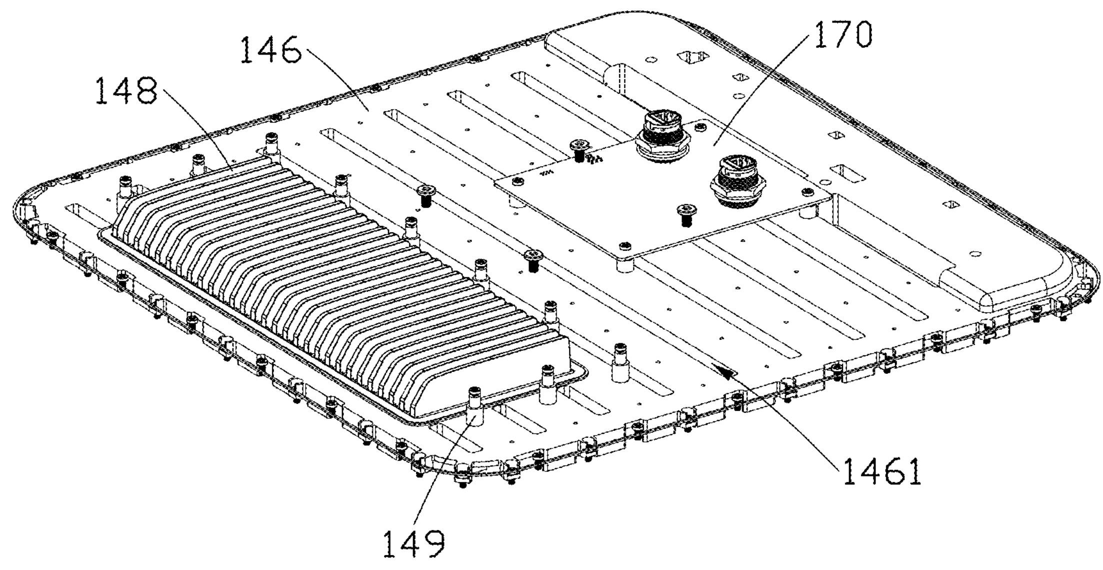
FIG. 6 is another structural diagram of the heat dissipation module of the antenna array device shown in FIG. 1.

Referring to FIG. 6, in some embodiments, the heat dissipation module 140 further includes a plurality of heat sinks 148. The plurality of heat sinks 148 are disposed at intervals at one end of a second side of the body 146. The heat sinks 148 are also made of heat conductive materials and are generally in the shape of sheets. A plane where the heat sinks 148 are located is generally vertically connected to a plane where the body 146 is located. Correspondingly, the lower cover 150 is further provided with heat dissipation slots 151 corresponding to the plurality of heat sinks 148 (see FIG. 2). The heat sinks 148 are exposed from the lower cover 150 through the heat dissipation slots 151. Thus, the heat-conducting structures 141 and the supporting structures 142 conduct heat to the heat sinks 148 through the body 146, so that the heat is transferred to the air outside the lower cover 150 through the heat sinks 148, thereby effectively dissipating heat. In some embodiments, the plurality of heat sinks 148 also extend radially outward. The present application increases a surface area by providing the plurality of heat sinks 148, thereby improving the efficiency of heat conduction to the air and improving the heat dissipation effect.

Please refer to FIG. 2 and FIG. 6, the heat dissipation module 140 further includes a plurality of bosses 149. The plurality of bosses 149 surround the plurality of heat sinks 148 and are disposed on the second side of the body 146. The plurality of bosses 149 are used to connect with the lower cover 150. In one embodiment, each boss 149 is provided with a locking hole. Accordingly, the lower cover 150 is provided with through holes around the heat dissipation slots 151. The body 146 of the heat dissipation module 140 and the lower cover 150 can be connected by the locking piece passing through the through hole and being partially received in the locking hole.

Please refer to FIGS. 4 and 6, in some embodiments, the plurality of heat-conducting structures 141, the plurality of supporting structures 142, the plurality of connecting structures 143, the body 146, the plurality of positioning posts 147, the plurality of heat sinks 148, and the plurality of bosses 149 are all formed of heat-conducting materials, and the plurality of heat-conducting structures 141, the plurality of supporting structures 142, the plurality of connecting structures 143, the body 146, the plurality of positioning posts 147, the plurality of heat sinks 148, and the plurality of bosses 149 can be integrally formed by a CNC (Computer numerical control machine tools) process. In other embodiments, the body 146 is also made of the heat-conducting material. The plurality of heat-conducting structures 141, the plurality of supporting structures 142, the plurality of connecting structures 143, the body 146, and the heat sink 148 can be spliced to form the heat dissipation module 140. In some embodiments, strip-shaped protrusions can be formed by bending the surface of the body 146 to serve as the heat-conducting structures 141, and correspondingly, grooves 1461 are formed on the second side of the body 146 corresponding to the positions of the heat-conducting structures 141, which is conducive to reducing a weight of the antenna array device 10.

Please refer to FIG. 2 again, in some embodiments, the edge of the circuit board 130 is further provided with a plurality of second positioning holes 132. Correspondingly, each dielectric layer and each radiation layer in the radiation module 120 is provided with a plurality of third positioning holes 121. By passing a plurality of fasteners through the corresponding second positioning holes 132 and third positioning holes 121, the positioning and connection between the circuit board 130 and the radiation module 120 can be achieved.

The lower cover 150 is also provided with a plurality of first mounting holes 152 on one side close to the heat dissipation module 140. The upper cover 110 is also provided with second mounting holes (not shown) corresponding to the plurality of first mounting holes 152. A plurality of mounting members pass through the corresponding first mounting holes 152 and are partially received in the second mounting holes, thereby achieving connection between the upper cover 110 and the lower cover 150.

In some embodiments, the antenna array device 10 further includes a sub-circuit board 170. The sub-circuit board 170 is disposed on a side of the heat dissipation module 140 away from the circuit board 130. That is, the sub-circuit board 170 is disposed between the heat dissipation module 140 and the lower cover 150. The sub-circuit board 170 is provided with a processor, a power conversion circuit, a modem board, a GPS (Global Positioning System) communication module, an interface, etc. The sub-circuit board 170 is electrically connected to the circuit board 130 for supplying power to the circuit board 130. In some embodiments, the power conversion circuit can also be disposed on the circuit board 130. The present application can reduce the area of the circuit board 130 by disposing the sub-circuit board 170.

An installation process of the antenna array device 10 is roughly as follows:

First, please refer to FIG. 2 again, a plurality of fasteners connect the plurality of second positioning holes 132 and the corresponding plurality of third positioning holes 121, so as to realize the positioning and connection between the circuit board 130 and the radiation module 120. Then, the through holes in the positioning posts 147 are aligned with the corresponding first positioning holes 131 and the receiving holes in the mounting posts, and the positioning members pass through the through holes and the first positioning holes 131, and are partially received in the receiving holes of the mounting posts, so as to realize the preliminary positioning of the upper cover 110, the circuit board 130, and the heat dissipation module 140. Then, referring to FIG. 7, the connecting members pass through the connecting structures 143 and the matching connecting structures on the inner side of the upper cover 110 to achieve the locking connection between the body 146 and the upper cover 110. Next, the locking members pass through the through holes of the lower cover 150 and are partially received in the locking holes of the bosses 149 to achieve the preliminary connection between the body 146 of the heat dissipation module 140 and the lower cover 150.

The first positioning holes 131, the second positioning holes 132, the third positioning holes 121, the through holes, the receiving holes, the mounting holes, the locking holes, the first mounting holes 152, and the second mounting holes mentioned in the present application may be threaded holes. Accordingly, the fasteners, the positioning members, the connecting members, the locking members, and the mounting members may be bolts, hot melt bolts, etc. The present application does not limit the connection or positioning method between the modules in the antenna array device 10. In other embodiments, the connection or positioning can also be carried out by means of adhesives and/or snap-fitting.

Figure 7:
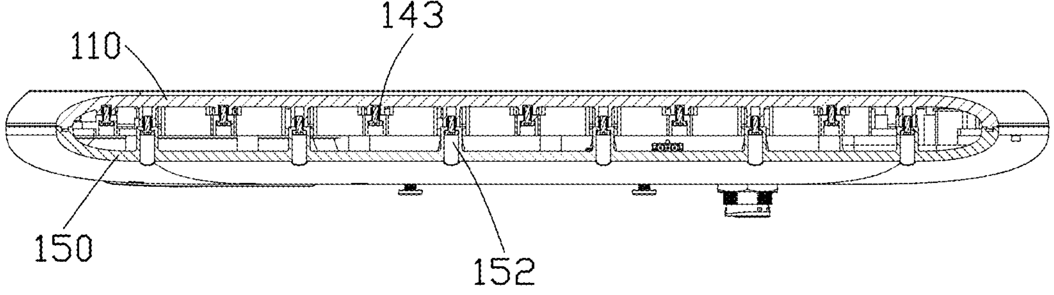
FIG. 7 is a cross-sectional view along an VI-VI line in FIG. 1.

Please refer to FIG. 7, in some embodiments, when the connecting structures 143 (or the positioning posts 147) is made of metal materials, a height of the connecting structure 143 (or the positioning post 147) is less than or equal to a height of the circuit board 130. In this way, the interference of the connecting structures 143 on the radiation module 120 can be reduced. Accordingly, in the present application, the upper cover 110 and the lower cover 150 are also made of insulating material to reduce the interference with the radiation module 120.

The present application does not limit the specific shape of the body 146. In other embodiments, the body 146 may also be a circular sheet or a polygonal sheet, etc.

In the present application, a waterproof gasket is further provided corresponding to the heat dissipation slots 151 and the connection between the upper cover 110 and the lower cover 150 to play a role of waterproofing, dustproofing, and reducing vibration.

In summary, the heat dissipation module 140 provided in the present application increases the heat conductivity of the heat-conducting structures 141 by setting the plurality of heat-conducting structures 141 to form an array, thereby effectively dissipating heat for the antenna array device 10; at the same time, the circuit board 130 is supported by the plurality of supporting structures 142 and the plurality of connecting structures 143 are connected to the upper cover 110, thereby reducing the probability of displacement of the radiation module 120 in the antenna array device 10 and improving the phase control accuracy of the antenna array device 10.

Figure 8:
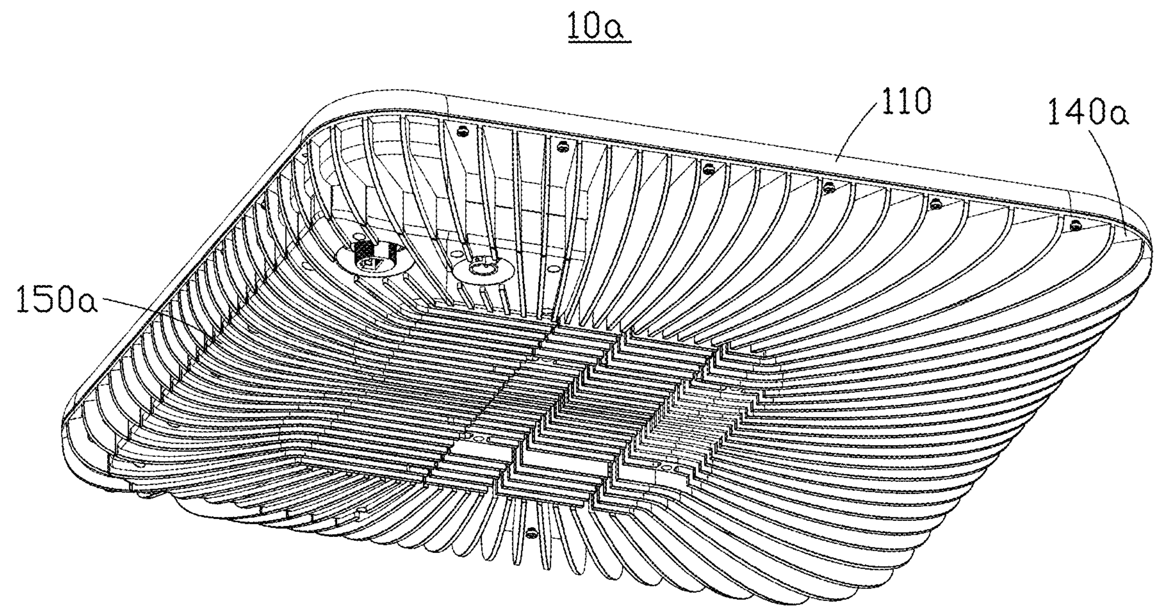
FIG. 8 is a structural diagram of an antenna array device according to another embodiment of the present application.
Figure 9:
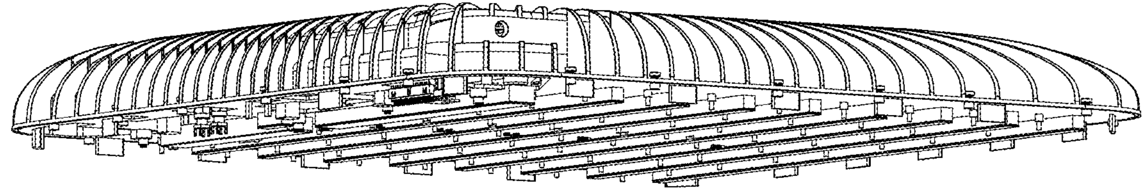
FIG. 9 is a structural diagram of heat dissipation module of the antenna array device shown in FIG. 8.

Please refer to FIG. 8 and FIG. 9, another embodiment of the present application further provides an antenna array device 10*a*. The antenna array device 10*a* includes the upper cover 110, the radiation module 120, the circuit board 130, a heat dissipation module 140*a*, and a lower cover 150*a*. A structure of the antenna array device 10*a* is substantially the same as that of the antenna array device 10, except that the heat dissipation module 140*a* and the lower cover 150*a* in the antenna array device 10*a* are different from the structures of the heat dissipation module 140 and the lower cover 150 in the antenna array device 10, and the placement position of the sub-circuit board 170 is different.

The structure of the heat dissipation module 140*a* is substantially the same as that of the heat dissipation module 140 in the antenna array device 10. The heat dissipation module 140*a* also includes the plurality of heat-conducting structures 141, the plurality of supporting structures 142, the plurality of connecting structures 143, the plurality of heat conductive sheets 144, the plurality of buffers 145, the body 146, and the plurality of positioning posts 147 (see FIG. 4). The difference between the heat dissipation module 140*a* and the heat dissipation module 140 lies in the different structural arrangement of the second side of the body 146, and in the heat dissipation module 140*a*, the second side of the body 146 and the lower cover 150*a* simultaneously serve as the bottom cover of the antenna array device 10*a* (see FIG. 8).

Figure 10:
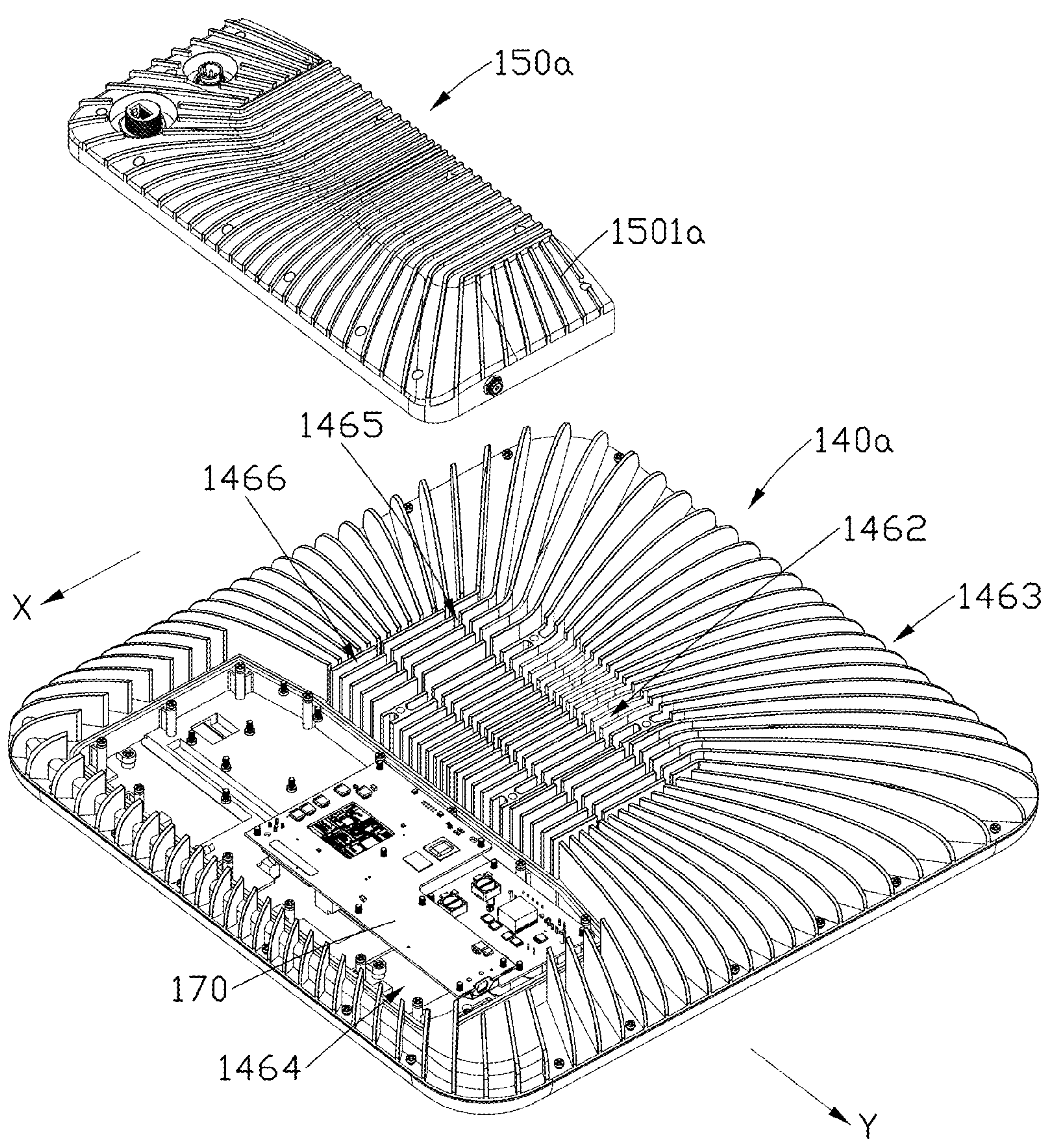
FIG. 10 is an explosive view of the antenna array device shown in FIG. 8.

Specifically, referring to FIG. 10, in this embodiment, the heat dissipation module 140*a* includes a plurality of first heat sinks 1481*a* and a plurality of second heat sinks 1482*a*. The second side of the body 146 includes a first area 1462 and a second area 1463. The first area 1462 is approximately located at a center of the second side. The body 146 is further provided with a receiving groove 1464 on one side of the first area 1462, and the receiving groove 1464 is used to receive the sub-circuit board 170. The second area 1463 surrounds the first area 1462 and the receiving groove 1464.

The plurality of first heat sinks 1481*a* are arranged in rows at intervals in the first area 1462. A first channel 1465 is formed between every two adjacent rows. In each row, a second channel 1466 is formed between every two adjacent first heat sinks 1481*a*. The first channel 1465 extends in a first direction (e.g., the Y direction in FIG. 10), and the second channel 1466 extends in a second direction (e.g., the X direction in FIG. 10). In this embodiment, the second direction is substantially perpendicular to the first direction.

The plurality of second heat sinks 1482*a* are arranged at intervals in the second area 1463, and the plurality of second heat sinks 1482*a* are centered on the first area 1462 and extend outward in a generally radial manner. Each second heat sink 1482*a* is generally arc-shaped, and the closer to the periphery of the body 146, the greater the curvature of the edge of the second heat sink 1482*a*. That is, each second heat sink 1482*a* is substantially fin-shaped and disposed on the second side of the body 146. Further, the plurality of second heat sinks 1482*a* located on the side of the first area 1462 away from the receiving groove 1464 are disposed one-to-one with the adjacent plurality of first heat sinks 1481*a*, so that the second channel 1466 continues to extend outward substantially radially in the second area 1463. At least two of the second heat sinks 1482*a* are disposed corresponding to the first channels 1465, such that the first channels 1465 continue to extend within the second area 1463.

In other embodiments, the plurality of second heat sinks 1482*a* may also extend in the second area 1463 in a corrugated shape or other shapes, and the present application is not limited to this.

In other embodiments, only the plurality of first heat sinks 1481*a* may be disposed at intervals on the second side of the body 146. The plurality of first heat sinks 1481*a* may extend outward in a radial, corrugated, or other shape.

In the heat dissipation module 140*a*, the heat-conducting structures 141, the supporting structures 142, the connecting structures 143, the body 146, the positioning posts 147, the first heat sinks 1481*a*, and the second heat sinks 1482*a* can be integrally formed from metal materials by a CNC (Computer numerical control machine tools) process, thereby improving the heat dissipation effect of the heat dissipation module 140*a*.

Figure 11:
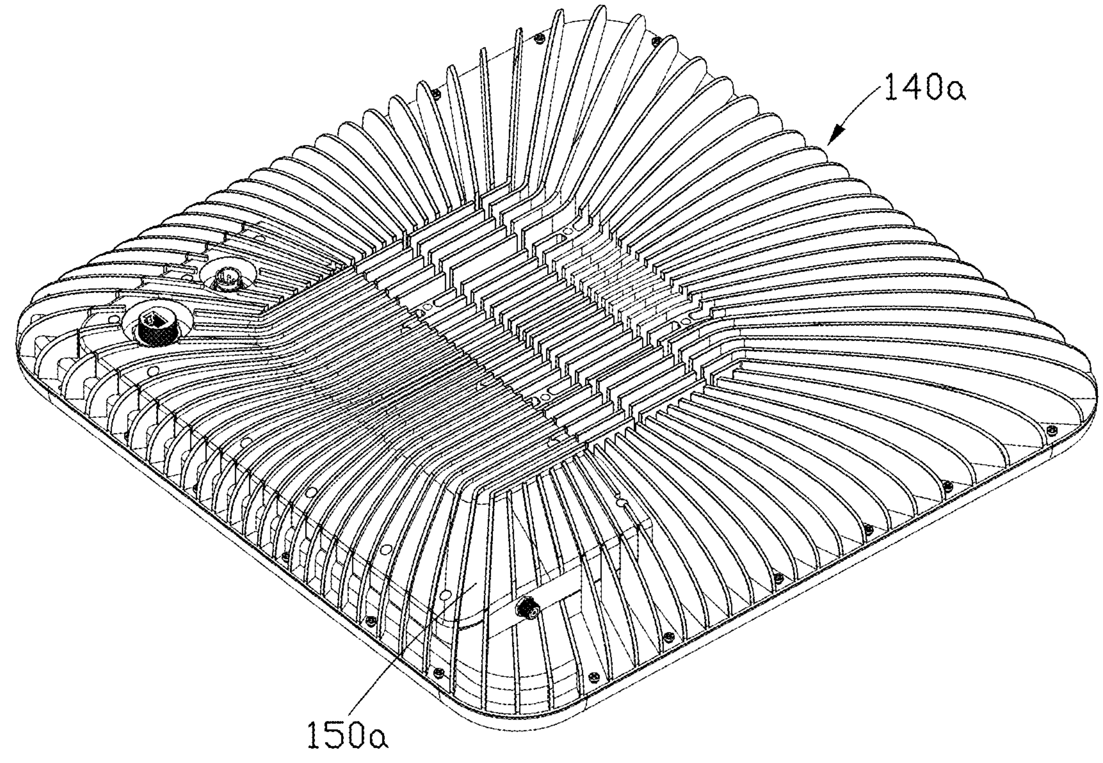
FIG. 11 is a structural diagram of the antenna array device shown in FIG. 8 in another view.

The lower cover 150*a* is used to cover the receiving groove 1464 to protect the sub-circuit board 170 in the receiving groove 1464. In this embodiment, in order to accelerate the heat dissipation speed of the sub-circuit board 170, a side of the lower cover 150*a* close to the sub-circuit board 170 may also be provided with the plurality of heat-conducting structures, the plurality of supporting structures, and the plurality of heat conductive sheets (not shown in FIG. 10). A plurality of third heat sinks 1501*a* are also disposed on a side of the lower cover 150*a* away from the sub-circuit board 170 corresponding to the plurality of second heat sinks 1482*a* in the second area 1463. Thus, when the lower cover 150*a* is covered on the receiving groove 1464, the second heat sinks 1482*a* located on the side of the first area 1462 close to the receiving groove 1464 are connected with the third heat sinks 1501*a*, so that the second channels 1466 continue to extend outward in a generally radial shape in the second area 1463 (see FIG. 11).

In this way, the heat dissipation module 140*a* provided in this embodiment is provided with the plurality of first heat sinks 1481*a* and the plurality of second heat sinks 1482*a*, the first channel 1465 and the second channel 1466 are formed on the second side of the body 146 through the plurality of first heat sinks 1481*a* and the plurality of second heat sinks 1482*a*, thereby further increasing the surface area of the heat dissipation module 140*a* in contact with the air, thereby improving the heat dissipation efficiency of the heat dissipation module 140*a*.

Figure 12:
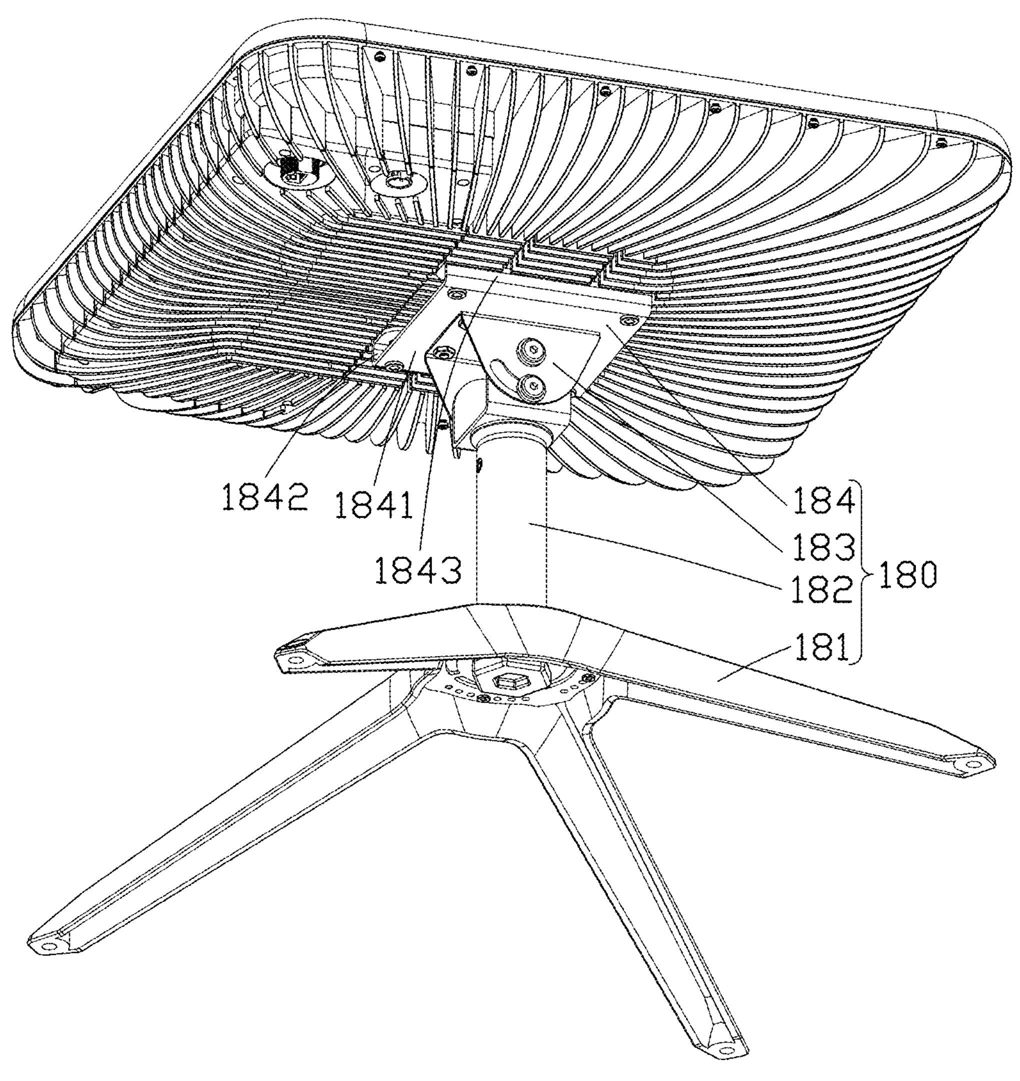
FIG. 12 is a structural diagram of the antenna array device shown in FIG. 8 connected to a support.

Please refer to FIG. 12, in one embodiment, the antenna array device 10*a* further includes a bracket 180. The bracket 180 is used to adjust the height and angle of the antenna array device 10*a*. The bracket 180 includes a base 181, a support member 182, an angle adjustment connector 183, and a coupling member 184. One end of the support member 182 is connected to the base 181, and the other end is connected to the angle adjustment connector 183. The angle adjustment connector 183 is connected to the second side of the body 146 through the coupling member 184.

Specifically, the coupling member 184 includes a first coupling portion 1841, a second coupling portion 1842, and a third coupling portion 1843. The first coupling portion 1841 is generally sheet-shaped. Both ends of the first coupling portion 1841 extend upward and then bend inward to form the second coupling portion 1842 and the third coupling portion 1843 respectively. Thus, the ends of the first coupling portion 1841 and the second coupling portion 1842 are at a height difference from the plane where the first coupling portion 1841 is located. In this embodiment, the second coupling portion 1842 and the third coupling portion 1843 are used to connect with the body 146. The first coupling portion 1841 is used to connect with the angle adjustment connector 183. In this way, there is a gap between the first coupling portion 1841 and the body 146, so as to reduce the influence of the coupling member 184 on the heat dissipation effect of the heat dissipation module 140*a*.

Furthermore, the base 181 is used to provide stable support for the antenna array device 10. The support member 182 is a retractable member, and a height of the antenna array device 10*a* is adjusted by adjusting a height of the support member 182. The angle adjustment connector 183 is used to adjust an angle of the antenna array device 10*a*. In this embodiment, the angle adjustment connector 183 can achieve angle adjustment through the cooperation between a fixed shaft and a rotating shaft (not shown in the figures). The angle adjustment connector 183 is not limited to the specific structure shown in FIG. 12, and the present application does not limit the specific structure of the angle adjustment connector 183. In other embodiments, other connectors for achieving angle adjustment may also be used, such as a movable hinge.

Thus, in this embodiment, by providing the bracket 180 on the antenna array device 10*a*, the antenna array device 10*a* can be adjusted in height and angle according to the use environment, thereby improving a flexibility of the antenna array device 10*a* when in use.

The antenna array device 10 may also be provided with the bracket 180, which will not be described in detail herein.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure, up to and including the full extent established by the broad general meaning of the terms used in the claims.

What is claimed is:

1. A heat dissipation module applied in an antenna array device, the antenna array device comprising an upper cover and a circuit board, the heat dissipation module comprising:

a body;

a plurality of heat-conducting structures arranged in an array on one side of the body;

a plurality of radiation units arranged on a side of the circuit board, the plurality of heat-conducting structures arranged on the other side of the circuit board away from the plurality of radiation units, the plurality of heat-conducting structures corresponding to the plurality of radiation units;

a plurality of supporting structures supporting the circuit board, the plurality of heat-conducting structures and the plurality of supporting structures arranged on a same side of the body; and a plurality of connecting structures arranged on an edge of the body and connected to the upper cover.

2. The heat dissipation module of claim 1, wherein the plurality of heat-conducting structures are made of heat-conducting materials.

3. The heat dissipation module of claim 1, wherein each of the plurality of heat-conducting structures is a strip structure, the plurality of heat-conducting structures are arranged in rows to form the array.

4. The heat dissipation module of claim 1, further comprising a plurality of heat conductive sheets, wherein at least one end of each of the plurality of heat-conducting structures is provided with a limiting portion, the limiting portion is configured to limit the plurality of heat conductive sheets.

5. The heat dissipation module of claim 4, wherein a heat conductivity of each of the plurality of heat conductive sheets is greater than or equal to 0.8 W/Mk, a hardness of each of the plurality of the heat conductive sheet is greater than or equal to 10 Shore, and is less than or equal to 70 Shore.

6. The heat dissipation module of claim 1, wherein a ratio of an area of the plurality of heat-conducting structures compared to an area of the plurality of radiation units is greater than or equals to 20%.

7. The heat dissipation module of claim 1, further comprising a plurality of heat sinks, wherein the plurality of heat sinks are arranged at intervals on another side of the body, the plurality of heat sinks extend radially outward.

8. The heat dissipation module of claim 1, further comprising a plurality of buffers, wherein the plurality of buffers are arranged between the plurality of supporting structures and the circuit board, the plurality of buffers are configured to buffer a moment when the plurality of supporting structures and the circuit board collide with each other.

9. The heat dissipation module of claim 1, further comprising a plurality of first heat sinks and a plurality of second heat sinks, wherein a side of the body that opposite to the plurality of heat-conducting structures and the plurality of supporting structures comprises a first area and a second area, the second area surrounds the first area, the plurality of first heat sinks are arranged in rows at intervals in the first area, plurality of second heat sinks are arranged at intervals in the second area, and the plurality of second heat sinks are centered on the first area and extend outward in a generally radial manner.

10. An antenna array device comprising:

an upper cover;

a circuit board; and a heat dissipation module comprising:

a body;

a plurality of heat-conducting structures arranged in an array on one side of the body;

a plurality of radiation units arranged on a side of the circuit board, the plurality of heat-conducting structures are arranged on the other side of the circuit board away from the plurality of radiation units, the plurality of heat-conducting structures are corresponding to the plurality of radiation units;

a plurality of supporting structures supporting the circuit board, the plurality of heat-conducting structures and the plurality of supporting structures arranged on a same side of the body; and a plurality of connecting structures arranged on an edge of the body and connected to the upper cover.

11. The antenna array device of claim 10, further comprising a lower cover and a plurality of radiation units wherein the plurality of radiation units are arranged on a side of the circuit board, the upper cover and the lower cover are connected and cooperatively form a receiving space, the plurality of radiation units, the circuit board, and the heat dissipation module are received in the receiving space.

12. The antenna array device of claim 11, wherein a ratio of an area of the plurality of heat-conducting structures compared to an area of the plurality of radiation units is greater than or equals to 20%.

13. The antenna array device of claim 10, further comprising a sub-circuit board, wherein the sub-circuit board is disposed on a side of the heat dissipation module away from the circuit board, the sub-circuit board is electrically connected to the circuit board.

14. The antenna array device of claim 10, wherein the plurality of heat-conducting structures are made of heat-conducting materials.

15. The antenna array device of claim 10, wherein each of the plurality of heat-conducting structures is a strip structure, the plurality of heat-conducting structures are arranged in rows to form the array.

16. The antenna array device of claim 10, wherein the heat dissipation module further comprises a plurality of heat conductive sheets, at least one end of each of the plurality of heat-conducting structures is provided with a limiting portion, the limiting portion is configured to limit the plurality of heat conductive sheets.

17. The antenna array device of claim 16, wherein a heat conductivity of each of the plurality of heat conductive sheets is greater than or equal to 0.8 W/Mk, a hardness of each of the plurality of the heat conductive sheet is greater than or equal to 10 Shore, and is less than or equal to 70 Shore.

18. The antenna array device of claim 10, wherein the heat dissipation module further comprises a plurality of heat sinks, the plurality of heat sinks are arranged at intervals on another side of the body, the plurality of heat sinks extend radially outward.

19. The antenna array device of claim 10, wherein the heat dissipation module further comprises a plurality of buffers, the plurality of buffers are arranged between the plurality of supporting structures and the circuit board, the plurality of buffers are configured to buffer a moment when the plurality of supporting structures and the circuit board collide with each other.

20. The antenna array device of claim 10, wherein the heat dissipation module further comprises a plurality of first heat sinks and a plurality of second heat sinks, a side of the body that opposite to the plurality of heat-conducting structures and the plurality of supporting structures comprises a first area and a second area, the second area surrounds the first area, the plurality of first heat sinks are arranged in rows at intervals in the first area, plurality of second heat sinks are arranged at intervals in the second area, and the plurality of second heat sinks are centered on the first area and extend outward in a generally radial manner.

* * * * *